United States Patent [19]
Wolters

[11] Patent Number: 5,266,524
[45] Date of Patent: Nov. 30, 1993

[54] METHOD OF MANUFACTURING A SEMICONDUCTOR DEVICE WHEREBY A LAYER CONTAINING ALUMINIUM IS DEPOSITED ON A SURFACE OF A SEMICONDUCTOR BODY

[75] Inventor: Robertus A. M. Wolters, Eindhoven, Netherlands

[73] Assignee: U.S. Philips Corp., New York, N.Y.

[21] Appl. No.: 947,031

[22] Filed: Sep. 17, 1992

[30] Foreign Application Priority Data

Sep. 19, 1991 [EP] European Pat. Off. ........ 91202415.5

[51] Int. Cl.⁵ .................... H01L 21/44; C23C 14/00
[52] U.S. Cl. ................... 437/194; 204/192.1; 204/192.12; 204/298; 204/09; 118/666; 148/DIG. 158
[58] Field of Search ........ 204/209.98, 298.12, 204/298.23, 192.1, 192.12, 192.15; 148/DIG. 158, DIG. 169; 437/194, 197

[56] References Cited

U.S. PATENT DOCUMENTS

| | | | |
|---|---|---|---|
| 4,886,565 | 12/1989 | Koshiba et al. | 204/298.09 |
| 4,911,812 | 3/1990 | Kudo et al. | 204/298.09 |
| 5,085,750 | 2/1992 | Saraoka et al. | 204/298.09 |

FOREIGN PATENT DOCUMENTS 4116930  4/1992  Japan ..................... 148/DIG. 158

Primary Examiner—Mary Wilczewski
Assistant Examiner—Ramamohan Rao Paladugu
Attorney, Agent, or Firm—Steven R. Biren

[57] ABSTRACT

A method of manufacturing a semiconductor device whereby a layer (3) containing aluminium is deposited by means of a sputter deposition process on a surface (1) of a semiconductor body (2) which is placed on a holder (21) in a reaction chamber (20). The semiconductor body (2) is cooled down to a temperature below 150 K. during the deposition process. A smooth, flat layer with a good step coverage is deposited in this way.

5 Claims, 2 Drawing Sheets

METHOD OF MANUFACTURING A SEMICONDUCTOR DEVICE WHEREBY A LAYER CONTAINING ALUMINIUM IS DEPOSITED ON A SURFACE OF A SEMICONDUCTOR BODY

BACKGROUND OF THE INVENTION

The invention relates to a method of manufacturing a semiconductor device whereby a layer comprising aluminium is deposited by means of a sputter deposition process on a surface of a semiconductor body which is placed on a holder in a reaction chamber.

The layer comprising aluminium may be a layer of pure aluminium, but alternatively a layer of aluminium to which up to a few percents of a different element, such as silicon or copper, have been added. It is also possible for more elements, such as both silicon and copper, to be added. Such additives serve to improve the properties of the aluminium layer.

The surface of a semiconductor body is in general not plane, but contains stepped structures which in practice may have, for example, a step height of 1 $\mu$m and a step width of 2 $\mu$m. Such structures then are, for example, contact holes having a diameter of 2 $\mu$m formed in an insulating layer of 1 $\mu$m thickness provided on the surface, or insulated conductor tracks having a height of 1 $\mu$m and a width of 2 $\mu$m provided on the surface at a mutual interspacing of 2 $\mu$m. These stepped structures in practice have side faces which it is comparatively difficult to cover with a layer comprising aluminium.

Methods of the kind mentioned above are known from S. Wolf and R. N. Tauber, "Silicon Processing for the VLSI Era", Lattice Press, vol. I, Process Technology, pp. 368-372, whereby the semiconductor body is heated in order to obtain a better step coverage.

It is found in the deposition of a layer comprising aluminium that a layer is formed on the side faces which has a thickness much smaller than the thickness of the rest of the layer. If a layer having a thickness of approximately 0.5 $\mu$m is deposited on a structure having the dimensions mentioned above by way of example, a layer is formed on the side faces of the stepped structures which has a thickness of no more than a quarter of this value. The process then has a step coverage (=ratio of the minimum thickness of the layer on the side faces to the thickness of the rest of the layer) of less than 25%. These differences in thickness will be greater in structures having smaller dimensions, so that the step coverage will thus be smaller. It is desirable, accordingly, to develop a process which provides a better step coverage.

The step coverage is not improved in practice by the said heating of the semiconductor body. A layer deposited in this way in addition shows a comparatively rough surface and a comparatively coarse-grained structure.

SUMMARY OF THE INVENTION

The invention has for its object inter alia to provide a method by which a comparatively plane layer comprising aluminium can be deposited with a step coverage which is greater than the said 25%.

According to the invention, the method mentioned in the opening paragraph is for this purpose characterized in that the semiconductor body is cooled down to a temperature below 150 K. during the deposition process. When a layer comprising aluminium is deposited by such a process on a structure of the same dimensions as in the example mentioned above, this structure will exhibit a plane surface and a step coverage of approximately 70%.

When a layer of aluminium is deposited on the surface of a semiconductor body by the known sputter deposition processes, the deposited atoms stick together owing to their great mobility, whereby clusters are formed. These clusters then grow until a closed layer is formed. The layer thus formed has a comparatively coarse-grained structure. A layer with grains having a diameter of, for example, approximately 0.5 $\mu$m is formed.

The said cluster do not cover the surface in a homogeneous manner during the deposition process. Comparatively few clusters are formed in locations where comparatively few atoms have been deposited. This is true in particular for the side faces of steps, where practically no clusters are formed. As a result of growth of clusters formed elsewhere, the side faces of the steps are ultimately also covered with aluminium. Accordingly, the layer on these side surfaces is closed after this has already happened elsewhere. The step coverage of this process is no more than 25%.

When a layer of aluminium is deposited by the sputter deposition process according to the invention-the semiconductor body being cooled down to a temperature of below 150 K.-a closed layer is created consisting of columns of aluminium having a diameter of approximately 0.02 $\mu$m. This layer has a comparatively smooth surface. No clusters are formed.

During the deposition process, the surface of the semiconductor body is hit not only by aluminium atoms but also by other particles, such as ions from the gas discharge. These particles transmit their energy of a few eV to aluminium atoms already deposited. This comparatively small additional energy plays no part at all in the known method described, but it does in the method according to the invention. The additional energy allows the atoms already deposited to move over the surface. The side faces of the steps are substantially not hit by these particles, so that the mobility of the atoms deposited there is not increased. Thus a stream of atoms towards the side faces of the steps can arise, whereby the step coverage is additionally improved.

An effective and homogeneous cooling-down of the semiconductor body is obtained if, according to the invention, the semiconductor body is cooled down in that the holder on which the semiconductor body is placed is cooled down to a temperature below 150 K., a gas cushion with a pressure of 100 to 2,000 Pa being maintained between the holder and the semiconductor body. More in particular, the holder on which the semiconductor body is placed is cooled down by means of liquid nitrogen.

Preferably, the sputter deposition process is carried out in two stages, the semiconductor body not being cooled down until during the second stage, whereas it is kept at a temperature above 0° C. during the first stage. It is avoided in that way that water, which in practice is always given off by walls and other parts of the reaction chamber, ends up on the surface of the semiconductor body. The water is trapped by aluminium atoms which are deposited on parts surrounding the holder. If the semiconductor body should first be cooled down to the said temperature below 150 K. and if the deposition should be started after that, water would condense on the surface of the semiconductor body before the start of the deposition. The deposition would be seriously hampered by this.

When the first stage is carried out a power smaller than that at which the second stage is carried out, sufficient aluminium is deposited on the said parts for water to be absorbed, while practically no aluminium is deposited on the surface of the semiconductor body compared with the total of the layer to be grown. The first stage is carried out, for example, at a power of 200 W, while the second stage is carried out at a power of 6 kW.

BRIEF DESCRIPTION OF THE FIGURES

The invention will be explained in more detail below, by way of example, with reference to the drawing, in which.

DETAILED DESCRIPTION OF THE INVENTION

Figure 1:
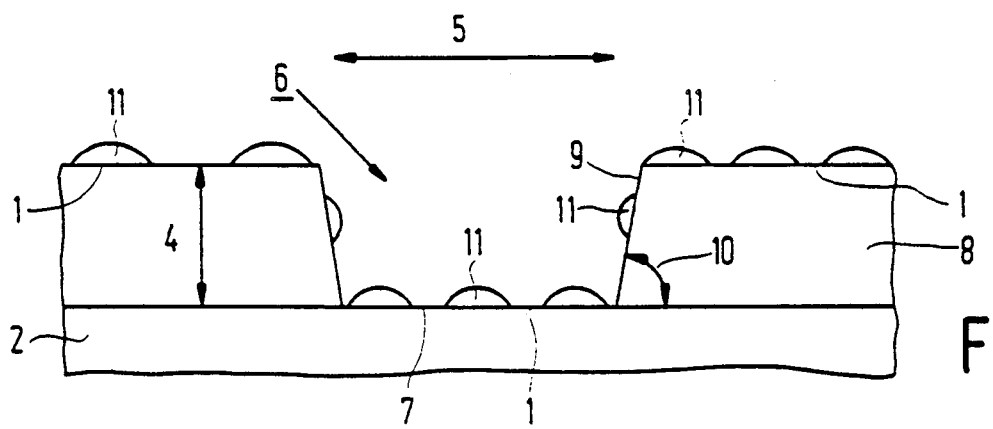
FIGS. 1 to 3 diagrammatically and in cross-section show several stages in the manufacture of a semiconductor device by means of known methods.
Figure 2:
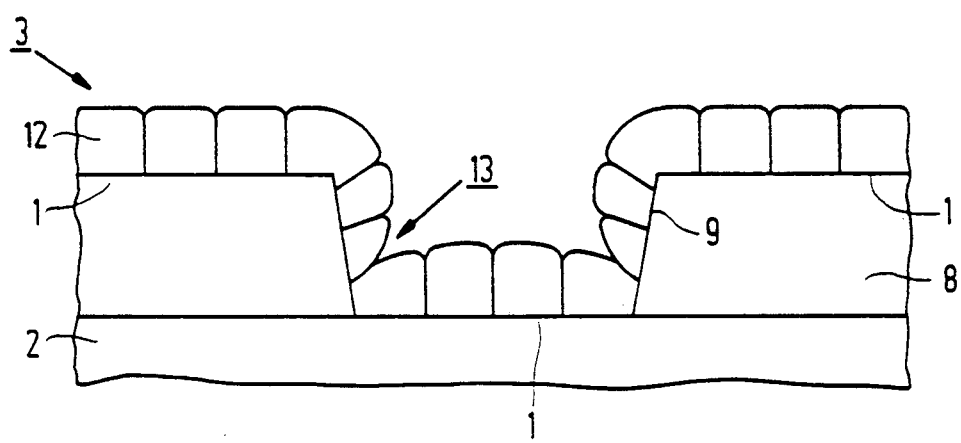
Figure 3:
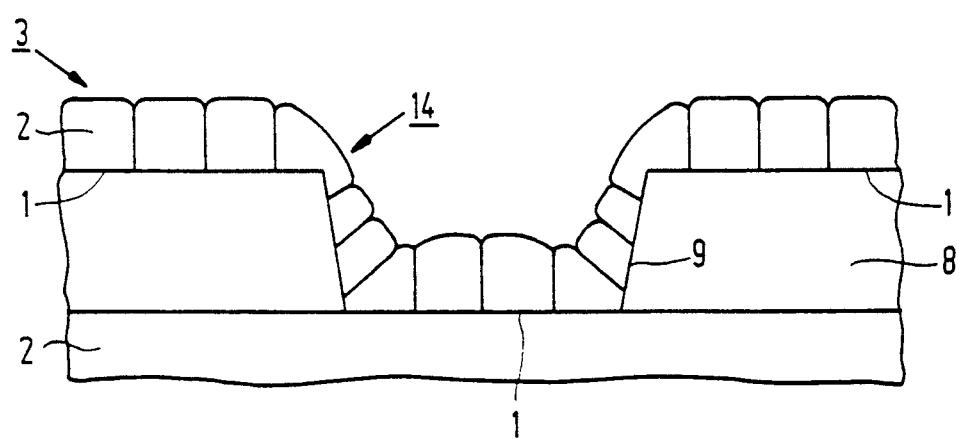
Figure 5:
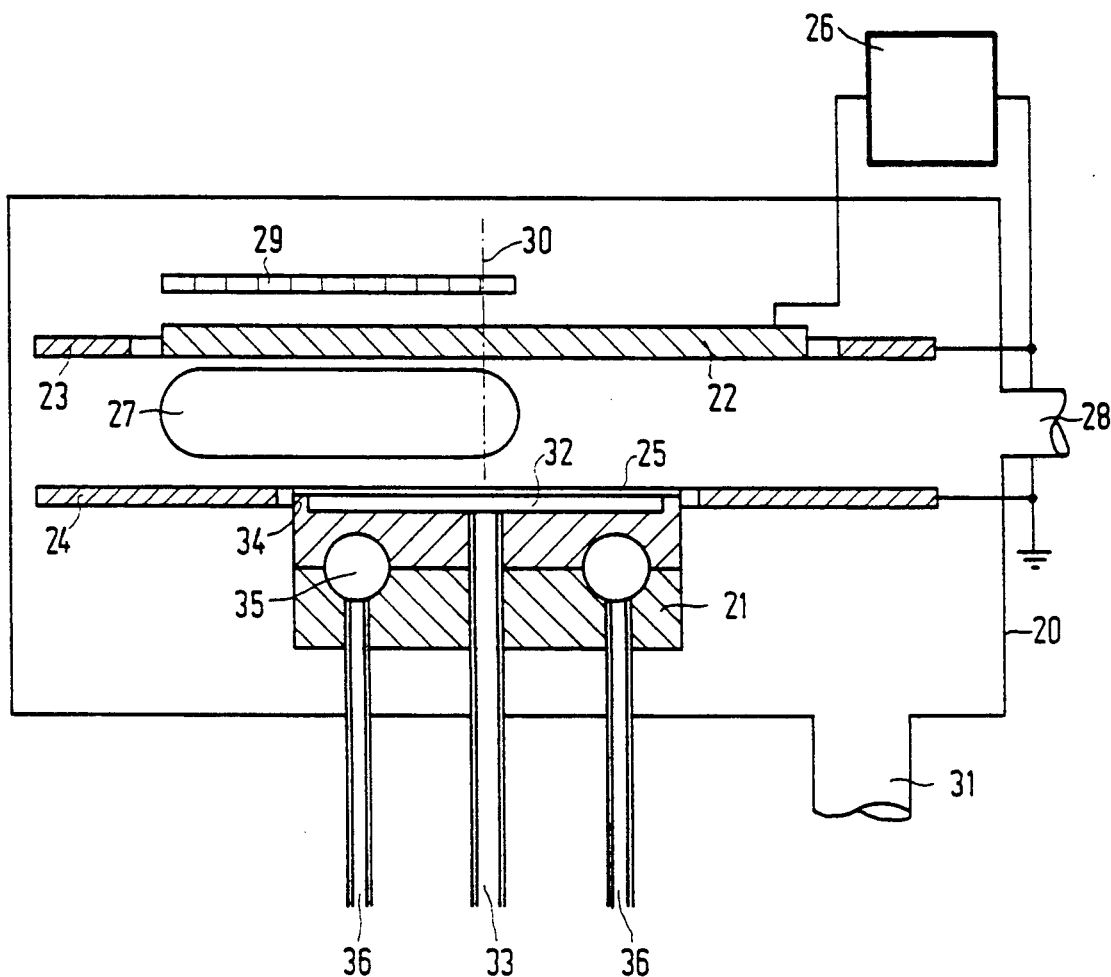
FIG. 5 diagrammatically shows a device for carrying out the method according to the invention.

FIGS. 1 to 3 diagrammatically and in cross-section show several stages in the manufacture of a semiconductor device by means of known methods for the manufacture of a semiconductor device, whereby a layer 3 comprising aluminium is deposited on a surface 1 of a semiconductor body 2 by means of a sputter deposition process. The semiconductor body 2—here a silicon slice—is for this purpose placed on a holder 21 in a reactor chamber 20 (FIG. 5). A sputtering target 22 comprising aluminium is arranged in the reactor chamber 20 opposite the semiconductor body 2. Around this target 22 there is grounded metal ring 23, while grounded screen 24 is arranged around the holder 21. A usual DC voltage source 26 is connected between the ring 23, screen 24, and target 22, whereby a plasma 27 can be generated with a voltage of 300 to 600 V in a gas which can be led into the reactor chamber 20 through a gas inlet 28. A usual rotatable system of magnets 29 is arranged behind the target 22. This system 29 can rotate about an axis 30. In practice, the system of magnets 29 rotates about the axis 30 a few times every second during the deposition process, so that the gas discharge is rotated along about this same axis 30. It is achieved by this that atoms are sputtered from the entire surface of the target 22 in a homogeneous manner, by which a homogeneous deposition process is obtained.

The chamber 20 is further provided with a gas outlet 31 which is connected to a pump (not drawn) by which gases can be removed and by which the reaction chamber may be kept at a desired pressure. The plasma 27 is generated, for example, in argon.

The layer 3 comprising aluminium may be a layer of pure aluminium, but alternatively it may be a layer of aluminium to which up to a few percents of a different element, such as silicon or copper, have been added. It is also possible for more elements, such as both silicon and copper, to be added. In these cases, the target 22 comprises these additives. Such additives serve to improve the properties of the aluminium layer.

The surface 1 of the semiconductor body 2 is not plane, but comprises stepped structures which exhibit a step height 4 of, for example, 1 μm and a step width 5 of, for example, 2 μm. In practice, for example, these are contact holes 6 with a flat bottom 7 and a diameter of 2 μm which are formed in an insulating layer 8 of 1 μm thickness provided on the semiconductor body 2. The said stepped structures in practice have side faces 9 which enclose an angle 10 of 80° to 85° with the flat bottom 7.

During the deposition of the layer 3 comprising aluminium, a layer is formed on the side faces 9 which has a thickness smaller than the thickness of the rest of the layer. The process has a step coverage (=ratio of minimum layer thickness on the side faces to the thickness of the rest of the layer) of less than one.

When a layer 3 of aluminium is deposited on the surface 1 of the semiconductor body 2 by means of usual, known sputter deposition processes, the said semiconductor body being heated during this, deposited atoms stick together owing to their great mobility at this elevated temperature, whereby clusters 11 are formed. These clusters subsequently grow until a closed layer 3 is formed. The layer thus formed accordingly exhibits a comparatively coarse-grained structure. For example, if a layer having a thickness of approximately 0.5 μm is deposited, grains 12 of approximately 0.5 μm diameter are formed (FIGS. 2 and 3).

The said clusters 11 do not cover the surface 11 in a homogeneous manner during the deposition process. Comparatively few and smaller clusters are formed in locations where comparatively few atoms are deposited. This is true in particular for the side faces 9 of the steps. Ultimately, the side faces 7 of the steps are also covered with aluminium mainly through growth of clusters formed elsewhere.

If the semiconductor body is heated to a temperature of approximately 150° C., the deposited layer 3 on the side faces 9 (FIG. 2) has a minimum thickness near its lower edge indicated by arrow 13; if the semiconductor body is heated to a temperature of approximately 350° C., the layer 3 will show a different thickness distribution owing to the greater mobility of the aluminium atoms during the deposition process. In the latter case the layer 3 (FIG. 3) has a minimum thickness near its upper edge indicated with arrow 14. In either case, this minimum thickness is approximately one quarter of the thickness on the bottom 7 and on top of the insulating layer 8. The step coverage therefore is 25% in both cases.

Figure 4:
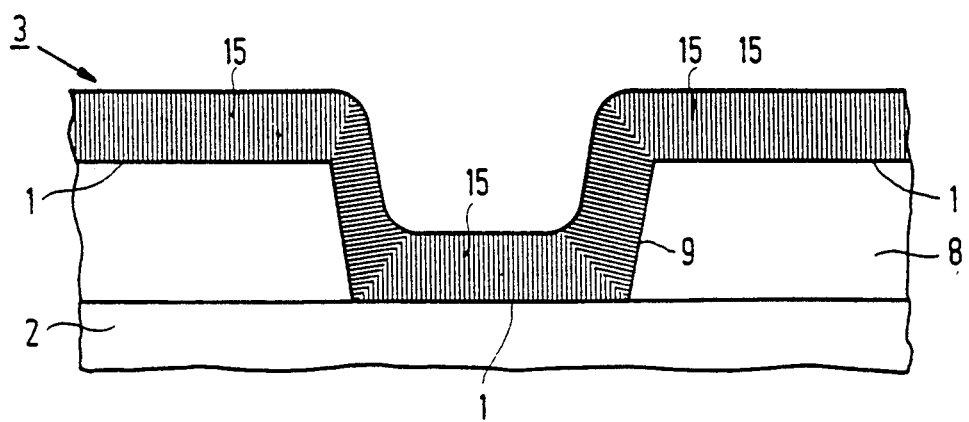
FIG. 4 diagrammatically and in cross-section shows a stage in the manufacture of a semiconductor device by means of the method according to the invention.

In the method according to the invention, the semiconductor body is cooled down to a temperature below 150 K. during the deposition process. When a layer comprising aluminium is deposited on the same structure (FIG. 4) in that case, a closed layer is formed which also covers the side faces 9 and which consists of aluminium columns 15 having a diameter of approximately 0.02 μm. The deposited layer 3 has a comparatively smooth surface. No clusters are formed.

During the deposition process, the surface 1 of the semiconductor body 2 is hit not only by aluminium atoms but also by other particles, such as aluminium and argon ions from the gas discharge 27. These particles transmit their energy of a few eV to the aluminium atoms already deposited. In the known methods described, this additional energy plays no part at all, since it is much smaller than the energy which the aluminium atoms have at the high temperature anyway, but it does play a part in the method according to the invention. The atoms already deposited are capable of moving over the surface owing to this additional energy. The side faces 9 of the steps are practically not hit by the said ions, so that the mobility of the atoms deposited there will be small. As a result a flow of atoms towards the side faces of the steps will arise, whereby the step coverage is further improved. A layer deposited by means of the method according to the invention has a flat surface and a step coverage of approximately 70%.

After the semiconductor body 2 has been placed on the holder 21 in the reaction chamber 20, the reaction chamber 20 is first evacuated through the gas outlet 31 to prepare for the deposition of the aluminium layer 3, upon which argon gas is admitted through the gas inlet line. Gas removal and supply are mutually so adjusted that a gas pressure of approximately 0.5 Pa is maintained in the reaction chamber 20 during the deposition.

According to the invention, the holder 21 is cooled down to a temperature below 150 K, a gas cushion 32 with a pressure of 100 to 2,000 Pa being maintained between the holder 31 and the semiconductor body 2. Argon gas is introduced between the holder 21 and the semiconductor body 2 through a gas line 33. The holder 21 is provided with a rim 34 against which the semiconductor body 2 is pressed by clamps (not shown). Leakage of argon gas from the gas cushion 32 into the reactor chamber 20 is limited by this. When the argon gas is admitted through the line 33 while the holder 21 is in the cooled-down state, the semiconductor body 2 will reach the desired temperature within a few seconds owing to removal of its heat through the gas cushion 32.

The holder 21 may be cooled in a simple manner in practice in that it is provided with a channel 35 through which liquid nitrogen is guided via lines 36. The holder then will have a temperature of approximately 80 K.

The gas discharge 27 is now generated by means of the DC voltage source 26. The target 22 has a diameter of, for example, 26 cm. The semiconductor body 2, which is placed at a distance of, for example, 5 cm from the target 22, has a diameter of approximately 15 cm.

Preferably, the sputter deposition process is carried out in two stages, the semiconductor body being cooled down only during the second stage, whereas it is kept at a temperature above 0° C. during the first stage. It is avoided in this way that water, which in practice is always given off by walls and other parts of the reaction chamber 20, ends up on the semiconductor body 2. The water molecules are trapped by the aluminium layer which is deposited on the ring 23 and the screen 24. If the semiconductor body 2 should first be cooled down to the said temperature of below 150 K. and if the deposition should be started after this, water could condense on the surface before the start of the deposition. The deposition would be seriously hampered by this.

When the first stage is carried out at a power smaller than that at which the second stage is carried out, sufficient aluminium is deposited on the ring 23 and the screen 24 for absorbing the said water, whereas practically no aluminium is deposited yet on the surface 1 of the semiconductor body 2 in comparison with the total layer to be grown. The first step is carried out, for example, at a power of 200 W while the second step is carried out at a power of 6 kW. A layer having a thickness of approximately 0.5 μm is then deposited in 50 seconds during the second stage.

I claim:

1. A method of manufacturing a semiconductor device whereby a layer comprising aluminium is deposited by means of a sputter deposition process on a surface of a semiconductor body which is placed on a holder in a reaction chamber, characterized in that the semiconductor body is cooled down to a temperature below 150 K. during the deposition process.

2. A method as claimed in claim 1, characterized in that the semiconductor body is cooled down in that the holder on which the semiconductor body is placed is cooled down to a temperature below 150 K., a gas cushion with a pressure of 100 to 2,000 Pa being maintained between the holder and the semiconductor body.

3. A method as claimed in claim 2, characterized in that the holder on which the semiconductor body is placed is cooled down by means of liquid nitrogen.

4. A method as claimed in claim 1, characterized in that the sputter deposition process is a two stage process, the semiconductor body not being cooled down until during the second stage, whereas it is kept at a temperature above 0° C. during the first stage.

5. A method as claimed in claim 4, characterized in that the first stage in the sputter deposition process is carried out at a power which is smaller than that at which the second stage is carried out.

* * * * *